United States Patent
Foss et al.

(10) Patent No.: US 6,580,652 B2
(45) Date of Patent: Jun. 17, 2003

(54) PRIORITY ENCODER CIRCUIT AND METHOD FOR CONTENT ADDRESSABLE MEMORY

(76) Inventors: Richard C. Foss, 28 Raith Gardens, Kirkaldy Fife (GB), KY25NJ; Alan Roth, 5012 Woodview Ave., Austin, TX (US) 78756

( * ) Notice: Subject to any disclaimer, the term of this patent is extended or adjusted under 35 U.S.C. 154(b) by 0 days.

(21) Appl. No.: 10/291,645

(22) Filed: Nov. 12, 2002

(65) Prior Publication Data

US 2003/0081481 A1 May 1, 2003

Related U.S. Application Data

(63) Continuation of application No. 09/984,870, filed on Oct. 31, 2001, now abandoned.

(51) Int. Cl.⁷ ................................................ G11C 7/00
(52) U.S. Cl. ..................... 365/203; 365/49; 365/230.03
(58) Field of Search ...................... 365/203, 49, 230.03, 365/189.07, 233, 189.08, 189.05

(56) References Cited

U.S. PATENT DOCUMENTS 5,274,596 A * 12/1993 Watanabe .................... 365/203

OTHER PUBLICATIONS

Yamagata, et al., "A 288–kb Fully Parallel Content Addressable Memory Using a Stacked Capacitor Cell Sructure", IEEE Journal of Solid State Circuits, vol. 27, No. 12, Dec. 1992, pp. 1927–1933.
Shultz et al., "Fully Parallel Integrated CAM/RAM Using Preclassification to Enable Large Capacities", IEEE Journal of Solid State Circuits, vol. 31, No. 5, May 1996.

* cited by examiner

*Primary Examiner*—David Lam
(74) *Attorney, Agent, or Firm*—Dowell & Dowell PC

(57) ABSTRACT

A circuit selects a highest priority signal from a plurality of input signals. The circuit comprises the following components. A plurality of serially coupled input blocks, each of which are coupled to a corresponding one of a plurality of input lines for receiving respective ones of the input signals and providing corresponding output signals. A pre-charging device coupled between a first supply voltage terminal and a first one of the serially coupled input blocks. The pre-charging device couples the supply voltage to the first one of the serially coupled input blocks in response to a clock pulse signal transition. An activation device coupled between a second supply voltage terminal and a last one of the serially coupled input blocks. The activation device couples the second supply voltage to the last one of the serially coupled input blocks in response to an activation signal transition.

13 Claims, 4 Drawing Sheets

PRIORITY ENCODER CIRCUIT AND METHOD FOR CONTENT ADDRESSABLE MEMORY

This application is a continuation of patent application Ser. No. 09/984,870 filed Oct. 31, 2001, now abandoned.

The present invention relates generally to the field of content addressable memories (CAMs) and particularly to a circuit and method for providing a highest priority binary memory match line address resulting from a search operation.

BACKGROUND OF THE INVENTION

A content addressable memory (CAM) is a binary or ternary memory storage device in which data is searched, read and written based on the content of the stored data, rather than the location where the data is stored. Each CAM memory cell is created by the intersection of a row and an associated match line and a column and associated search line. A CAM typically compares externally-provided search data with stored data in each row of the CAM array and provides match results on multiple match lines. The match results are subsequently provided to a priority encoder which converts the match results into a binary address representing the highest priority matching address. Each match line provides a "hit" or "match" indication if the stored data word matches the search word and provides a "miss" or "mis-match" indication if the stored data does not match the search word. Each row and match line combination has a unique N-bit address within the CAM. Accordingly, for any search cycle there may be up to $2^N$ match lines activated. Using the N-bit address generated by the priority encoder, the CAM may provide the address as an output for applications such as IP routing table lookup, compression and decompression.

Usually within the context of CAM array, the highest priority matching word is located at the lowest physical address in the CAM array and, accordingly, the lowest priority matching word is located at the highest physical address in the CAM array.

It may be well appreciated that a complex array of standard static boolean logic gates is required to achieve this function. This problem is further complicated by a requirement to deliver address information at a full data rate of the search-and-compare function of the CAM. The most difficult logic operation that a priority encoder must perform is to detect the highest priority match line and to disable any and all lower priority match lines at a high speed. Once the single highest priority match line output has been resolved, a programmable logic array (PLA) or read-only-memory memory (ROM) is used to convert the highest priority match line output into a binary address. The function of detecting the highest priority match line and disabling all lower priority match lines is conventionally implemented using an array of standard boolean logic gates. Examples of such approaches are proposed by Yamagata et al. in IEEE publication "A 288-kb Fully Parallel Content Addressable Memory Using a Stacked Capacitor Cell Structure", IEEE Journal of Solid State Circuits Vol. 27, No. 12, December 1992 pp. 1927–1933 and by Shultz et al. in IEEE publication "Fully Parallel Integrated CAM/RAM Using Preclassification to Enable Large Capacities," IEEE Journal of Solid State Circuits Vol. 31, No. 5, May 1996. However, the resulting static logic gate implementations are relatively complex and consume large areas of semiconductor as well as introduce substantial propagation delays. Accordingly, there is a need for an efficient high-speed priority encoder for resolving a highest priority match which exhibits reduced circuit complexity and area consumed.

SUMMARY OF THE INVENTION

In accordance with an aspect of the present invention there is provided a circuit for selecting a highest priority signal from a plurality of input signals. The circuit comprises the following components. A plurality of serially coupled input blocks, each of which are coupled to a corresponding one of a plurality of input lines for receiving respective ones of the input signals and providing corresponding output signals. A pre-charging device coupled between a first supply voltage terminal and a first one of the serially coupled input blocks. The pre-charging device couples the supply voltage to the first one of the serially coupled input blocks in response to a clock pulse signal transition. An activation device coupled between a second supply voltage terminal and a last one of the serially coupled input blocks. The activation device couples the second supply voltage to the last one of the serially coupled input blocks in response to an activation signal transition. The second supply voltage is propagated through the plurality of input blocks to an input block having an input signal voltage that is different from a predefined voltage state. The second supply voltage terminal is subsequently provided as the only output from said plurality of input blocks representing a highest priority match signal.

BRIEF DESCRIPTION OF THE DRAWINGS

An embodiment of the invention will now be described by way of example only with reference to the following drawings in which.

DESCRIPTION OF THE PREFERRED EMBODIMENTS

Figure 1A:
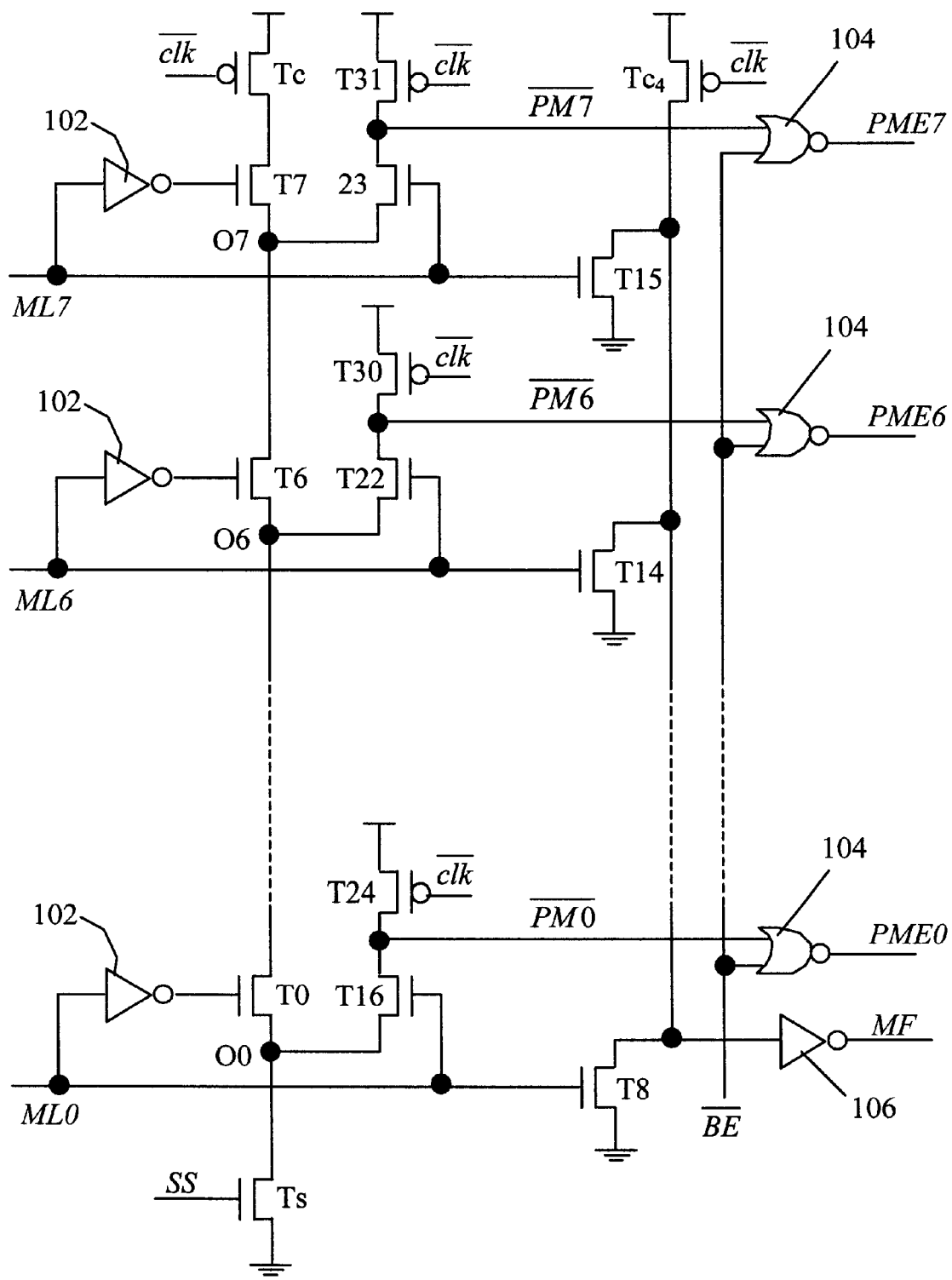
FIG. 1(a) is a circuit diagram of a priority encoder according to an embodiment of the invention.

For convenience, in the following description like numerals refer to like structures in the drawings.

Referring to FIG. 1(a), there is shown an eight match line priority encoder (PE) circuit 100 according to a first embodiment of the present invention. Although a group of eight match lines are illustrated in FIG. 1(a), it will be understood that in a normal CAM array, there are many groups of match lines which are provided as inputs to a priority encoder. The eight match line priority encoder receives eight input signals ML0–ML7 which are coupled to eight match lines of a CAM array (not shown). ML0 is the highest priority match line and ML7 is the lowest priority match line. For the present embodiment, it is assumed that each match line coupled to the input signals ML0–ML7 is active high. That is, the match line is pre-charged to a logic low and is driven to logic high value only in case a match occurs between the CAM search word and its stored CAM data word during search operation. Otherwise, in case of a mismatch, the match line remains logic low. As a result of pre-charging match lines to a logic low and pulling only matching match lines to a logic high, significant power reduction in search operations is achieved. This approach is discussed in co-pending MOSAID Technologies Inc. Canadian patent application No. 2,345,845, which is hereby incorporated by reference. Furthermore, as an alternative to directly connecting the match lines to the priority encoder blocks, the match line results may be first latched and then provided to the priority encoder blocks in order to allow for higher speed operation.

Each of the eight inputs ML0–ML7 is coupled, via an inverter 102, to a respective gate input of a transistor in a chain of series-coupled NMOS transistors T0–T7. The transistor chain T0–T7 is coupled at one end to a positive supply voltage VDD via a PMOS transistor Tc and at another end to VSS via an NMOS transistor Ts. The PMOS transistor Tc is gated by an inverse clock signal $\overline{clk}$ and the NMOS transistor Ts is gated by a strobe signal SS. Intermediate output nodes O0–O7 are located at the source of each NMOS transistor in the series chain of transistors T0–T7. Each intermediate output node O0–O7 is coupled to the source of an associated one of transistors T16–T23, which are NMOS transistors. The drains of transistors T16–T23 are coupled to respective drains of transistors T24–T31, which are PMOS transistors. The source of the PMOS transistors T24–T31 is coupled to a positive supply voltage VDD. Transistors T24–T31 are gated by an active low clock signal $\overline{clk}$.

Priority match signals $\overline{PM0}$–$\overline{PM7}$ are provided from the junction of the drain of transistors T16–T23 and the drain of transistors T24–T31. As shown, the priority match signals $\overline{PM0}$–$\overline{PM7}$ are active low and are pre-charged to logic high by associated PMOS transistors T24–T31. The priority match signals $\overline{PM0}$–$\overline{PM7}$ are provided as inputs into respectve 2-input NOR-gates 104 for generating respective output signals PME0–PME7. A second input of the NOR-gates 104 is coupled to line carrying a block enable signal $\overline{BE}$. The block enable signal $\overline{BE}$ will be discussed in more detail with respect to the operation of the circuit.

The match line inputs ML0–ML7 are further coupled to respective gates of transistors T8–T15. The transistors T8–T15 have their source terminals coupled to VSS. Their drain terminals are coupled in parallel to VDD via a PMOS transistor $Tc_4$, and as well as to an inverter 106 for generating a match flag MF output. The PMOS transistor $Tc_4$ is gated by the active low clock signal $\overline{clk}$. The operation of the priority encoder of FIG. 1 will be described after a brief discussion of FIG. 2.

Figure 2:
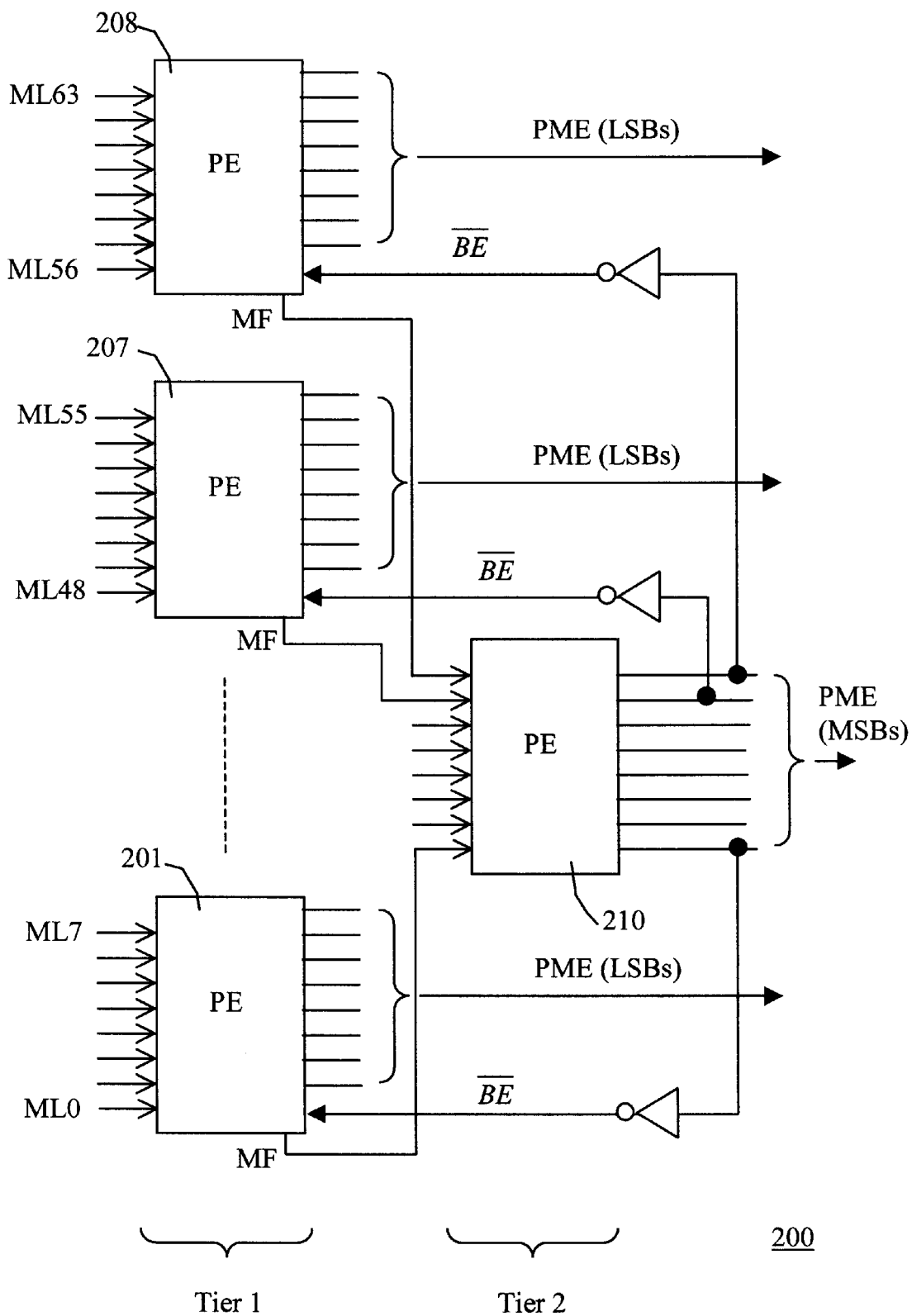
FIG. 2 is a circuit diagram of a hierarchy of priority encoder blocks.

Referring to FIG. 2, a group of priority encoders and their associated hierarchy is illustrated generally by number 200. For the present embodiment, it is assumed that a CAM array has 64 match line outputs ML0–ML63. Therefore, the match line outputs are sub-divided into eight groups, each having eight match line outputs. Each group of eight match line outputs is input to a corresponding first tier priority encoder 201–208. According to an embodiment of the invention, the structure of each priority encoder (PE) 201–208 is preferably the structure detailed in FIG. 1(a). Each priority encoder 201–208 has a group of 8 outputs, or priority match encoder (PME) outputs. The priority encoder 201–208 generates an output signal if there is at least one match and the block enable signal $\overline{BE}$ is activate. According to arrangement as shown in FIG. 2, the hierarchy of priority encoders has a total of 64 outputs PME0–PME63. Each priority encoder further includes a match flag MF output.

The match flag MF output from each first tier priority encoder is coupled to a corresponding input of a second tier priority encoder 210. The structure of the second tier priority encoder 210 is also the same as that detailed in FIG. 1(a). The additional priority encoder 210 has eight outputs. Each of the eight outputs is fed back to an associated priority encoder 201–208 for providing the block enable signal $\overline{BE}$ via an inverter.

Outputs from the first tier priority encoders 201–208 indicating a match are used to provide the least significant bits of the priority match encoder (PME), while the outputs from the second tier priority encoder 210 are used to provide the most significant bits of the PME. This is explained in greater detail with respect to a description of the operation of the circuit, which follows below.

Referring once again to FIG. 1(a) the operation of the priority encoder circuitry according to an embodiment of the invention is described. As previously mentioned, the match lines input to each priority encoder are active high, that is match lines are pulled to logic high in case of a match condition between search and stored data in any CAM cell. Therefore, the inputs remain pre-charged to logic low until a match is indicated during a search operation of the CAM array. The pre-charge operation occurs with the falling edge of the active low clock $\overline{clk}$ which causes transistors T24–T31 to turn on and provide a logic high to priority match signals $\overline{PM0}$–$\overline{PM7}$. In addition, transistor Tc is also turned on, pre-charging the drain of transistor T7 to VDD. Since match lines are pre-charged to logic low, outputs of inverter 102 will be high, turning on devices T0–T7 and thereby pre-charging nodes O0–O7 to VDD–Vtn, where Vtn is the threshold voltage of the NMOS transistors. Thereafter, the active search cycle begins. Since multiple matches may occur during a search and compare operation, more than one of the match line inputs may be pulled to logic high during one search and compare operation.

Assume, for example, match lines ML6 and ML7 both indicate a match. Therefore, match lines ML0–ML5 remain pre-charged to logic low and match lines ML6 and ML7 are both pulled to logic high. The logic low levels of match lines signals ML0–ML5 are provided at the gate terminals of transistors T8–T13 and transistors T16–T21, leaving them turned off. Conversely, transistors T0–T5 are turned on, since they are gated by the inverse of the match line signals ML0–ML5. Having transistors T8–T13 turned off indicates that there was no match on match lines ML0–ML5. Having transistors T16–T21 turned off prevents the priority match signals $\overline{PM0}$–$\overline{PM5}$ from turning on (going low). Once the match line inputs have settled, the transistor Ts is turned on by activating the strobe signal SS, coupling the source terminal of transistor T0 to a low voltage VSS. Since transistors T0–T5 are turned on, the low voltage VSS quickly propagates to the source terminal of transistor T6.

However, since the match line signal ML6 is high, the transistor T6 is turned off. Therefore, the low voltage VSS cannot propagate any further up the transistor chain. Rather, it is diverted to priority match signal $\overline{PM6}$ since transistor T22 is turned on by match line signal ML6. Therefore, the priority match signal $\overline{PM6}$ goes low. Furthermore, transistor T14 is turned on by match line signal ML6, which as a result of inverter 106, causes the match flag output MF to go high, indicating that at least one of the match inputs is high. That is, the match flag output MF indicates that there is at least a single match and possibly a multiple match.

Conceptually, this propagation of the logic low level along the path T0–T5 can be thought of as a wave. Essentially, a logic low signal wave is started by enabling strobe SS and propagated through the series chain of transistors T0–T7. The pulsing of SS and the subsequent initiation of the wave begins only after match line inputs have settled to a steady state. The wave propagates up the chain until it reaches a match is found at which point the wave is diverted to provide the highest priority match for this block.

Even though match line signal ML7 is also pulled to logic high, priority match signal $\overline{PM7}$ remains at the logic high, that is inactive. Since T6 is turned off, the low voltage does VSS not propagate through to the source terminal of transistors T7 and T23, the voltage at priority match signal $\overline{PM7}$ remains high due to the pull up voltage VDD provided to $\overline{PM7}$ via PMOS transistor T31 during the match line precharge operation. This is true even though the match line ML7 causes transistor T23 and transistor T15 to turn on. Therefore, the highest priority match signal, in this case $\overline{PM6}$, is generated in such a manner that no lower priority output can result.

Once the block enable signal $\overline{BE}$ is activated, the output signal PME6 is activated. Since $\overline{PM6}$ and $\overline{BE}$ are both active low, the corresponding NOR-gate 104 will only result in a logic high output if both inputs are logic low. Output signals PME0–PME5 and PME7 remain inactive, maintaining a logic low output on PME0–PME5 and PME7. For the present embodiment, the output signals PME0–PME7 are active high.

Figure 1B:
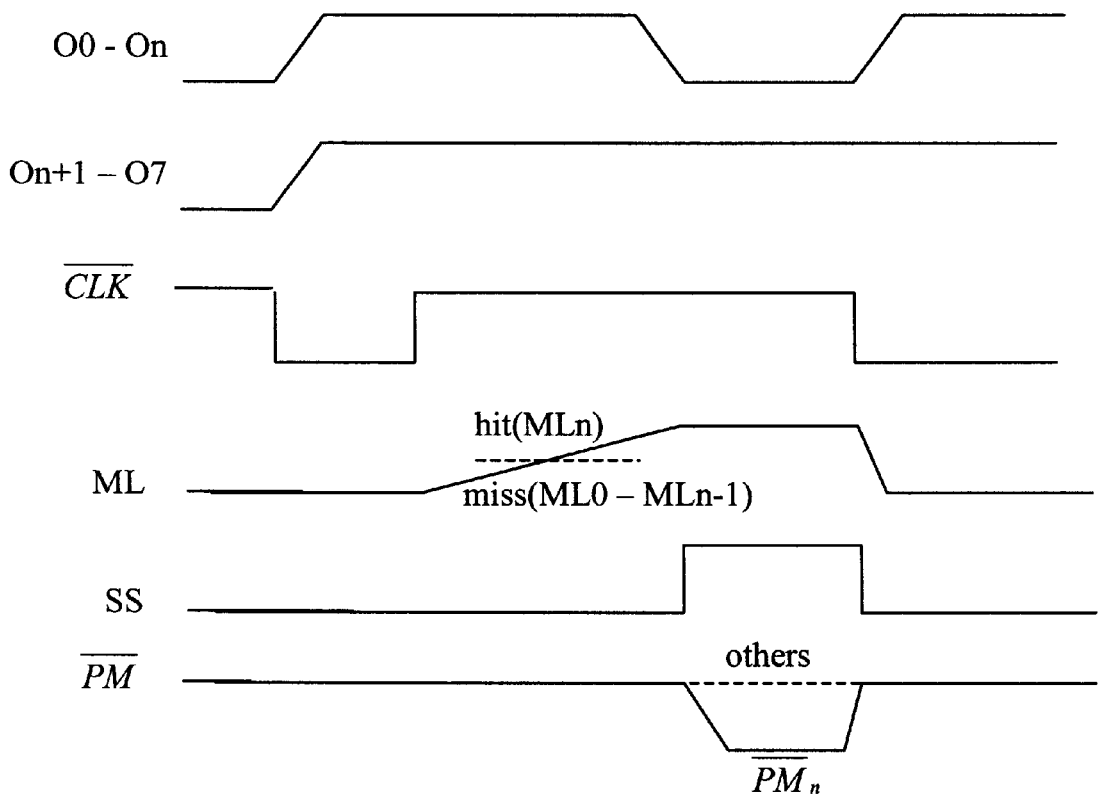
FIG. 1(b) is a timing diagram illustrating the operation of the circuit in FIG. 1(a)

Referring to FIG. 1(b) a timing diagram is illustrated. The timing diagram illustrates the general case where n represents the bit location of a match within a block shown in FIG. 1(a), and n+1 and higher bit positions represent the bits above the first match location. The outputs O0–On therefore are shown separate from outputs On+1–O7 to illustrate the different response of the various outputs. With match lines pre-charged to VSS, and the active low clock signal $\overline{clk}$ asserted low, outputs O0–O7 are pulled high to a VCC-Vtn level via the inverters 102 inverting the logic low signals on the pre-charged match lines which are applied to transistors T0–T7. Vth is the threshold voltage drop occuring across transistor T7. After a short period of time, the active portion of the search operation begins and match lines exhibiting a match condition begin to rise. In this case, it is assumed that match line n has a match and that match lines ML0–MLn−1 have mismatches. Whether match lines MLn+1–ML7 have matches or mismatches does not affect the outputs. Once MLn reaches a certain threshold voltage, the match condition is detected, which switches the input to inverter 102 corresponding to match line MLn from a low to a high. Simultaneously, the rising MLn begins to turn on its associated transistor in the chain T8–T15, which in turn provides a high output on the match flag output MF.

After another short period of time, required for ensuring that the match lines have been properly sensed, the strobe signal SS is asserted. This begins the propagation of the VSS voltage level up the chain Ts–Tn, where n represents the location of match line MLn that has been identified as having a match condition. Note that all outputs up to and including the matching match line input signals O0–On are pulled to logic low as the VSS voltage propagates up the chain Ts–Tn. The resulting intermediate priority match signal \PMn signal is pulled low while all other intermediate priority match signals \PM0–\PMn−1 and \PMn+1–\PM7 remain logic high. Outputs On+1 and above remain logic high regardless of match or mismatch conditions on those nodes because the path to VSS bas been cut and thus outputs \PMn+1 and above remain high or inactive.

A limitation on the number of series transistors T0–T7 in this priority encoder block is defined by the propagation time in the series chain. In the present embodiment, the limit is assumed to be eight for illustrative purposes only. The ability to use a larger, or fewer, number of series transistors will be apparent to a person skilled in the art. Further, the ability to encode a number of inputs greater than that allowed by a single encoder block is achieved by utilizing a plurality of blocks in a hierarchical layout as illustrated in FIG. 2. This provides customizable scalability to the encoding scheme.

For example, to encode 64 match line inputs, eight priority encoder blocks 201–208 are provided in a first tier of encoding. Continuing the example, assume that in addition to match line signals ML6 and ML7, match line signal ML62 is also high, indicating a match. Therefore, the match flags from priority encoder 201 and priority encoder 208 are high. The remaining match flags are low. All the match flags are provided to respective inputs of a single second-tier eight-input priority encoder 210. The functionality of the second tier priority encoder 210 is identical to each of the eight priority encoders 201–208 in the first tier. The block enable signal $\overline{BE}$ for the second tier priority encoder 210 is controlled by an external signal. In the present embodiment, it is always active, although other embodiments will be apparent to a person skilled in the art.

The second tier priority encoder block 210 determines which, if any, of the first tier blocks indicates a match. Since the match flag signal MF from the first priority encoder block 201 is high, it drives the output signal PME0 of the second tier priority encoder block 210 high. Also, it prevents any other block from indicating a match, similar to match line signal ML6 preventing ML7 from indicating a match as described with reference to FIG. 1(a). Therefore, even though the match flag signal MF from priority encoder 208 is high, the corresponding output signal PME7 of the second tier priority encoder block 210 is held low by the high MF signal from the first priority encoder block 201.

Thus the second tier priority encoder block 210 determines which of the first tier priority encoder blocks 201–208 holds the highest priority match. Each of the second tier priority encoder's eight output signals PME0–PME7 is fed back to a respective one of the first tier priority encoder blocks 201–208 as its block enable $\overline{BE}$ input, via an inverter. Therefore, only one of the priority encoder blocks 201–208 is enabled and provides a signal through its eight outputs PME0–PME7.

This hierarchical model can be repeated indefinitely subject to the cumulative delay through each tier being acceptable. For example, a three-tier system can be implemented as follows. The match flags from the first tier are used as inputs to the priority encoder blocks in the second tier, and the match flags from the second priority encoder block are used as inputs to the priority encoder blocks in the third tier. The priority encoder blocks of the third tier are always enabled and therefore, once the highest priority match has been determined, the third tier priority encoder enables the corresponding second tier priority encoder and only that corresponding second tier priority encoder, which enables only the corresponding first tier encoder. The output signals from the enabled priority encoders are used for determining the binary address. The output signals from the enabled first-tier priority decoder determine the least significant bits, the output signals from the enabled second-tier priority decoder determine the next least significant bits, and the output signals from the enabled third-tier priority decoder determine the most significant bits. Pipelining techniques can be used to improve throughput of such a multi-tier structure although such pipelining will introduce some latency as pipeline delays build up.

The outputs from the final tier of priority encoder blocks, for example tier 2 outputs in the embodiment described with reference to FIG. 2, are input to a programmable logic array (PLA), or preferably a read only memory (ROM), encoder. The PLA or ROM encoder is used to decode the inputs into a binary address representing the highest priority match line address. It is apparent that the outputs of the blocks, both from the first and second tiers, have a "1-out-of-n" format for each tier. In the present embodiment, both the first and second tier blocks have 8 outputs and therefore have a "1-out-of-8" format. Since there are 8 first tier input blocks 201–208, each having 8 match line inputs, there are 64 possible match line inputs into the first tier priority decoder blocks. The 8 output lines PME0–PME7 of the selected first tier block are used to encode the first 3 most significant bits of the highest priority match address. The 8 output lines of the second tier priority encoder block are used to encode the least significant 3 bits of the match address. Since only one block, or none, can be enabled depending on the results of a search and compare operation, all outputs of both the first and second tier priority encoder blocks can be provided as inputs into a Read-Only Memory (ROM) encoder. The binary encoded ROM in this two-tier example will therefore have 72 (64 from the first tier blocks+8 from the second tier block) inputs and 6 complementary binary address outputs A0, \A0–A5, \A5, for a total of 12 output signals.

Figure 3:
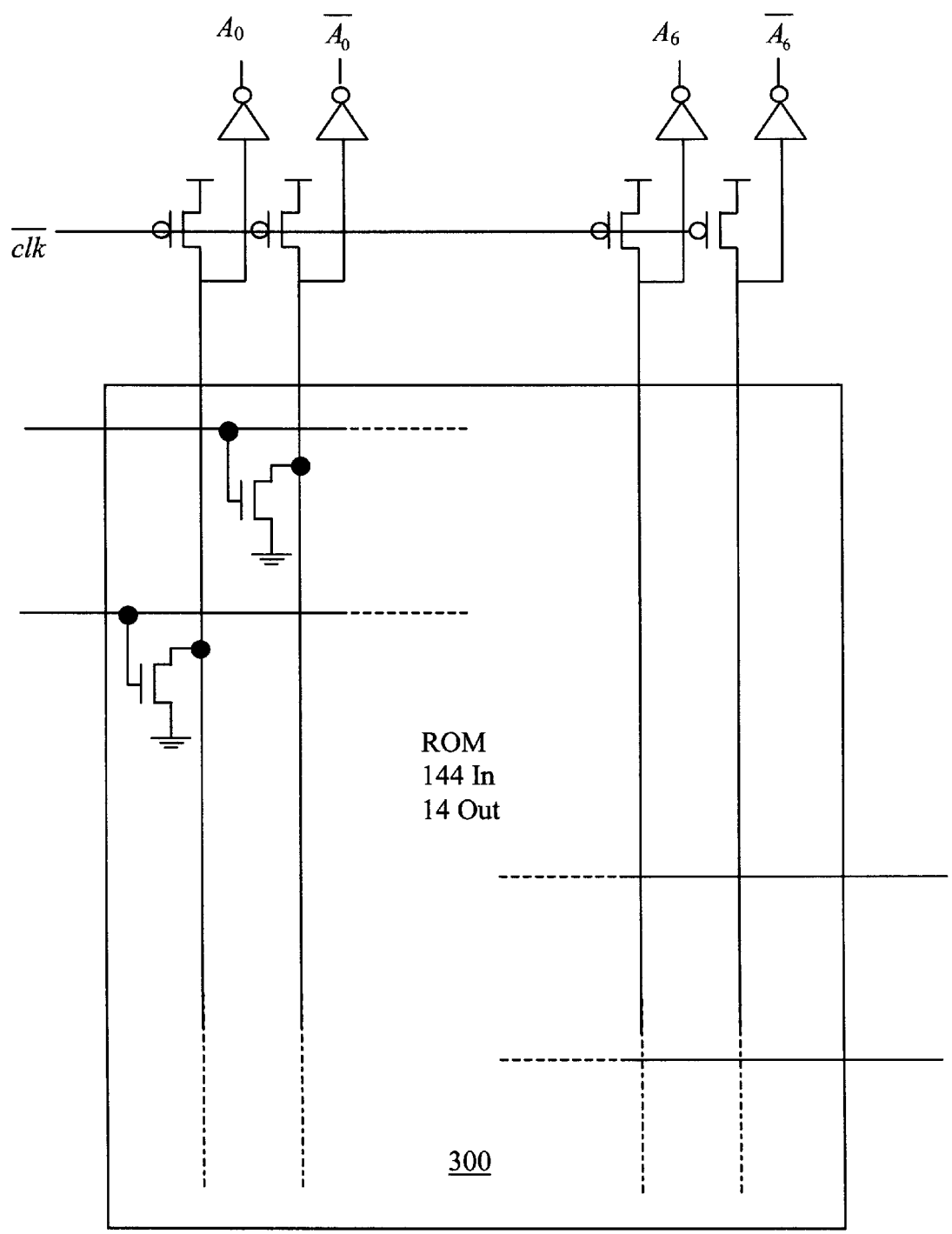
FIG. 3 is a diagram of ROM (Read Only Memory) positioned between two CAM cell arrays.

The layout pitch of the ROM inputs can be smaller than that of the input match lines. For a 2:1 improvement in area efficiency, for example, one ROM encoder and the associated first and second tier priority encoder blocks described in FIG. 2 are positioned between two CAM cell arrays. Referring to FIG. 3, such a configuration is illustrated generally by numeral 300. Each CAM cell array (not shown) would therefore feed its match line signals as inputs into priority encoding blocks, which would in turn provide inputs into the ROM. Since CAM arrays would be positioned on both sides of the ROM, the outputs from the priority encoding blocks of each CAM array would be provided to the ROM in an interleaved manner. The output of the ROM is therefore increased to a 7-bit binary address output A0, \A0–A6, \A6. The extra bit provides the output address with an indication as to which CAM cell array the address was generated from. As illustrated, the ROM provides two complementary addresses for each address bit. Therefore 14 complementary address outputs are used for representing the 7-bit address.

Figure 4:
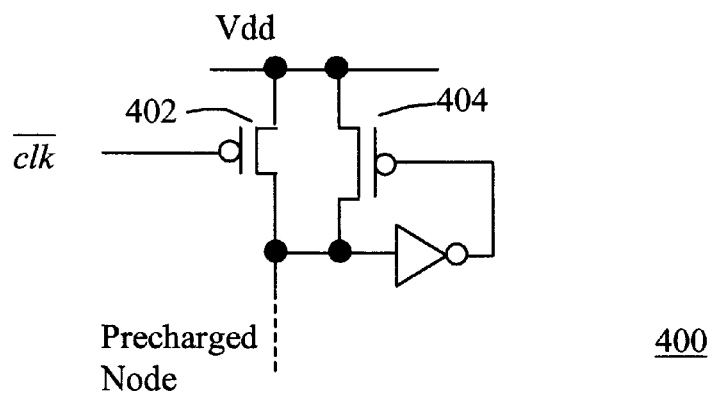
FIG. 4 is a circuit diagram of a sample latching circuit.

In the circuitry described with reference to FIG. 1(a), p-channel devices driven by a low-going clock serve to pre-charge what are effectively composite dynamic logic gates. To reduce any risk, especially during long cycles, each pre-charge transistor can be supplemented by a weak hold-up device driven from a minimal inverter. This configuration, illustrated in FIG. 4, is referred to as a "sticky latch" 400 and is well known in the art. The sticky latch 400 comprises two transistors 402 and 404 coupled in parallel, but with different (width/length) W/L ratios. That is, transistor 404 is much weaker than transistor 402 so that it can be easily overpowered by the pull-down path. As illustrated in FIG. 4, a minimum sized inverter is employed as a driver. A first terminal of the transistors 402 and 404 is coupled to VDD. A second terminal of the transistors is coupled to the circuit as required. The first transistor 402 is gated by the active low clock signal $\overline{clk}$. The second transistor is gated by the inverse of a signal at the second terminal.

Furthermore, series logic chains, as in T0 to T7 are known to be susceptible to pattern-sensitivity. However, in the present embodiment, the initial state of the match line input guarantees that T0 through T7 are all "on" at the time of pre-charge. Thus all intermediate nodes will start at the same level of VDD-Vtn, where Vtn is the threshold voltage of the NMOS transistors.

The most obvious merit of a priority encoding circuit according to the invention is the overall reduction in transistor count by replacing standard CMOS static logic gates with a composite dynamic logic structure. While an 8 series chain is slower than a single gate, it accomplishes the entire 1-from-8 priority function in a single stage and is cascadable hierarchically so that the width of the priority span grows rapidly. Relatively few stage delays give a wide bit coverage.

A less obvious advantage of the present invention is its potential to be laid out efficiently on a silicon integrated circuit. The match line outputs from a CAM cell array feed into the priority encoder. The simple series chain of input devices facilitates the required pitch matching. Lastly, performing the overall function in identical cascadable blocks all feeding into a ROM to convert the inputs into a n-to-binary code, allows multiple use of blocks with the same layout. A ROM has by its nature a very regular and compact layout and as a result, the layout of the overall priority encoding system can be highly efficient.

While the above description refers to certain signals as being active high or active low, a person skilled in the art will appreciate that the signals may be reversed with minor modifications to the circuitry. Although the invention has been described with reference to certain specific embodiments, various modifications thereof will be apparent to those skilled in the art without departing from the spirit and scope of the invention as outlined in the claims appended hereto.

The embodiments of the invention in which an exclusive property or privilege is claimed are defined as follow:

1. A circuit for selecting a highest priority signal from a plurality of input signals, said circuit comprising:
   a) a plurality of serially coupled input blocks, each of said input blocks being coupled to a corresponding one of a plurality of input lines for receiving respective ones of said input signals and providing corresponding output signals;
   b) a pre-charging device coupled between a first supply voltage terminal and a first one of said serially coupled input blocks, said pre-charging device coupling said first supply voltage to said first one of said serially coupled input blocks in response to a clock pulse signal transition;
   c) an activation device coupled between a second supply voltage terminal and a last one of said serially coupled input blocks, said activation device coupling said second supply voltage to said last one of said serially coupled input blocks in response to an activation signal transition;
   whereby said second supply voltage is propagated through said plurality of input blocks to an input block having an input signal voltage that is different from a predefined voltage, and whereby said second supply voltage terminal is subsequently provided as the only output from said plurality of input blocks representing a highest priority match signal.

2. A circuit as defined in claim 1, wherein said second supply voltage is propagated through said plurality of input blocks from a highest priority input block to a lowest priority input block.

3. A circuit as defined in claim 2, further including a plurality of output blocks each coupled to a corresponding one of said plurality of serially coupled input blocks for enabling said output signal indicative of said highest priority match signal.

4. A circuit as defined in claim 3, wherein said output blocks further include an enable signal.

5. A circuit as defined in claim 4, wherein said output signal is only enabled if said corresponding input signal is active and said enable signal is active.

6. A circuit as defined in claim 4 wherein said enable signal is common to all of said output blocks.

7. A circuit as defined in claim 1, wherein said circuit further includes a match flag signal generator for indicating whether or not at least one of said input signals is a match.

8. A circuit as defined in claim 1, wherein said input block comprises a switch for switching said second power supply to one of either said output signal or a next highest priority input block in accordance with said input signal voltage.

9. A circuit as defined in claim 8, wherein said switch comprises:
   a) a first transistor serially coupled between adjacent switches; and
   b) a second transistor coupled between a source of said first transistor and said output signal;
   wherein said first transistor is switched on when said input signal voltage is the same as said predefined voltage and said second transistor is switched on when said input signal voltage is different from said predefined voltage.

10. A circuit for providing a binary address corresponding to a highest priority signal selected from a plurality of input signals, said circuit comprising:
    a) an initial tier of priority encoders, each encoder for detecting a local highest priority signal from a plurality of associated input signals and generating a match signal if said local highest priority signal is detected;
    b) at least one subsequent tier of priority encoders for selecting a highest priority encoder from said previous tier of priority encoders in accordance with said match signals
    c) an enable signal for selectively enabling output of said highest priority encoder; and
    c) a memory for receiving said output signals from said priority encoders and providing an address signal in accordance with a binary equivalent of said output signals of said enabled priority encoders and a final tier encoder.

11. A circuit as defined in claim 10, wherein said initial tier represents least significant bits of said address signal, subsequent tiers represent subsequent significant bits of said binary output signal, and said final tier represents most significant bits of said binary output signal.

12. A method for generating a highest priority match output signal from a plurality of input signals, said method comprising the steps of:
    a) propagating a supply voltage through a plurality of serially coupled input blocks;
    b) using said supply voltage to provide said highest priority match output signal from a corresponding input block having an input signal voltage that is different from a predefined voltage; and
    c) preventing said supply voltage from propagating further through said plurality of serially coupled input blocks if said highest priority match output is detected, thereby prohibiting multiple outputs.

13. A method as defined in claim 12, further comprising the steps of:
    a) generating a match signal if at least one of said input signals provides said highest priority match output signal; and
    b) outputting said highest priority match output signal only if said highest priority match output signal is detected and an enable signal is active.

* * * * *